(12) United States Patent
Fujita (10) Patent No.: US 9,202,907 B2
(45) Date of Patent: Dec. 1, 2015

(54) PROTECTION DIODE (71) Applicant: Mitsubishi Electric Corporation, Tokyo (JP)

(72) Inventor: Koichi Fujita, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/532,060

(22) Filed: Nov. 4, 2014

(65) Prior Publication Data

US 2015/0054060 A1 Feb. 26, 2015

Related U.S. Application Data (62) Division of application No. 13/739,042, filed on Jan. 11, 2013, now Pat. No. 8,907,424.

(30) Foreign Application Priority Data

Apr. 10, 2012 (JP) .................................. 2012-089538

(51) Int. Cl.
*H01L 29/66* (2006.01)
*H01L 29/78* (2006.01)
*H01L 27/02* (2006.01)

(52) U.S. Cl.
CPC ........ *H01L 29/7808* (2013.01); *H01L 27/0248* (2013.01); *H01L 27/0255* (2013.01)

(58) Field of Classification Search
None
See application file for complete search history.

(56) References Cited

U.S. PATENT DOCUMENTS

| 3,667,009 | A | 5/1972 | Rugg |
| 5,204,988 | A * | 4/1993 | Sakurai ........................ 257/356 |
| 8,159,033 | B2 | 4/2012 | Hayashi |
| 2006/0252192 | A1 | 11/2006 | Inagawa et al. |

FOREIGN PATENT DOCUMENTS

| JP | 59-44872 A | 3/1984 |
| JP | 61-35568 A | 2/1986 |
| JP | 2006-261376 A | 9/2006 |
| JP | 2009-238973 A | 10/2009 |

OTHER PUBLICATIONS

State Intellectual Property Office of the People's Republic of China; Office Action in Chinese Patent Application No. 201310120769.2 (Jun. 2, 2015).

* cited by examiner

*Primary Examiner* — Sonya D McCall Shepard
(74) *Attorney, Agent, or Firm* — Leydig, Voit & Mayer, Ltd.

(57) ABSTRACT

A protection diode includes: a semiconductor substrate; a well region of a first conductivity type in the semiconductor substrate; a gate side diffusion region of a second conductivity type in the semiconductor substrate and joined to the well region; a grounding side diffusion region of the second conductivity type in the semiconductor substrate, separated from the gate side diffusion region, and joined to the well region; a gate side electrode connected between a gate of a transistor and the gate side diffusion region; a grounding electrode connected to the grounding side diffusion region; and an insulating film on the well region. The grounding electrode extends to the well region on the insulating film.

2 Claims, 7 Drawing Sheets

PROTECTION DIODE

BACKGROUND OF THE INVENTION

1. Field of the Invention

The present invention relates to a protection diode for protecting the gate oxide film of the MOS field effect transistor (hereinafter referred to as MOSFET) from surge breakdown.

2. Background Art

In general, the thickness of a gate oxide film used in the MOSFET is several tens of nanometers. Therefore, when a surge is inputted into the gate and the gate voltage reaches several kilovolts, the gate oxide film is broken down. For preventing this, a protection diode to discharge a surge is inserted in the gate. As protection diodes, not only vertical diodes, but horizontal diodes have been used (for example, refer to Japanese Patent Laid-Open No. 2009-238973). As a horizontal protection diode, there is a horizontal bidirectional diode wherein a P-type gate side diffusion layer, an N-type well layer, and a P-type grounding side diffusion layer are transversely arrayed on a semiconductor substrate.

SUMMARY OF THE INVENTION

Since the impurity concentration in the gate side diffusion layer and grounding side diffusion layer are identical in the conventional horizontal bidirectional diodes, the positive and negative breakdown voltages become equivalent. For making an MOSFET operate at a high output, the positive gate voltage amplitude needs to be wide. Therefore, the positive breakdown voltage of the protection diode needs to be elevated. However, since the surge transient current reaches to several tens of amperes, if the breakdown voltage is elevated, the voltage in surge application exceeds the withstand voltage of the gate oxide film due to increase of the serial resistance in the yield time, and the characteristics deterioration or the breakdown of the MOSFET occurs. In addition, if a plurality of diodes is connected in parallel for ensuring the desired surge current withstand, the chip size becomes enlarged.

In view of the above-described problems, an object of the present invention is to provide a protection diode which can realize higher outputs.

According to the present invention, a protection diode includes: a semiconductor substrate; a well layer of a first conductive type on the semiconductor substrate; a gate side diffusion layer of a second conductive type on the semiconductor substrate and joined to the well layer; a grounding side diffusion layer of a second conductive type on the semiconductor substrate, separated from the gate side diffusion layer, and joined to the well layer; a gate side electrode connected between a gate of a transistor and the gate side diffusion layer; and a grounding electrode connected to the grounding side diffusion layer. An impurity concentration in the grounding side diffusion layer is lower than an impurity concentration in the gate side diffusion layer.

The present invention makes it possible to realize higher outputs.

Other and further objects, features and advantages of the invention will appear more fully from the following description.

DETAILED DESCRIPTION OF THE PREFERRED EMBODIMENTS

A protection diode according to the embodiments of the present invention will be described with reference to the drawings. The same components will be denoted by the same symbols, and the repeated description thereof may be omitted.

First Embodiment

Figure 1:
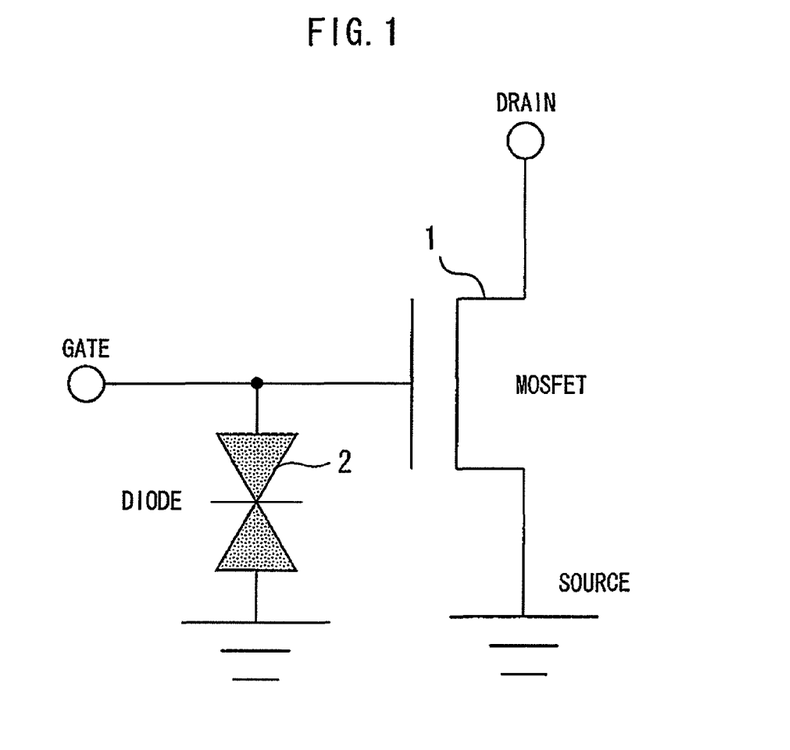
FIG. 1 is a circuit diagram showing a semiconductor device according to the first embodiment of the present invention.

FIG. 1 is a circuit diagram showing a semiconductor device according to the first embodiment of the present invention. A protection diode 2 is connected between the gate of an MOSFET 1 (MOS field effect transistor) and the grounding point. The protection diode 2 is a horizontal bidirectional diode for protecting the gate oxide film of the MOSFET 1 from surge breakdown.

Figure 2:
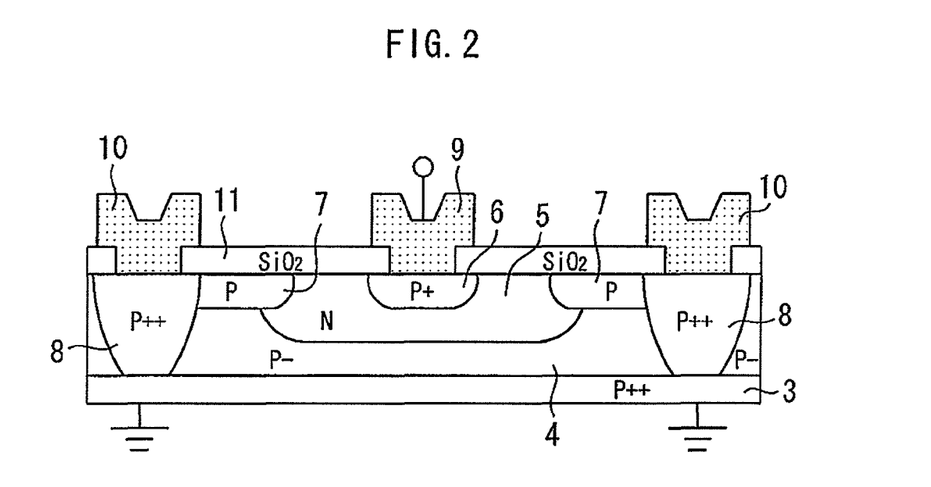
FIG. 2 is a sectional view showing the protection diode according to the first embodiment of the present invention.

FIG. 2 is a sectional view showing the protection diode according to the first embodiment of the present invention. The $P^{++}$-type silicon substrate 3 of which main material is silicon is grounded. A $P^-$-type epitaxial layer 4 is provided on the P++-type silicon substrate 3.

On the $P^{++}$-type silicon substrate 3 and the $P^-$-type epitaxial layer 4, an N-type well layer 5, $P^+$-type gate side diffusion layer 6, a P-type grounding side diffusion layer 7, and a $P^{++}$-type diffusion layer 8 are transversely arrayed. The $P^+$-type gate side diffusion layer 6 is joined to the N-type well layer 5. The P-type grounding side diffusion layer 7 is separated from the $P^+$-type gate side diffusion layer 6, and joined to the N-type well layer 5.

The gate side electrode 9 is connected between the gate of the MOSFET 1 and the $P^+$-type gate side diffusion layer 6. The grounding electrode 10 is connected to the P-type grounding side diffusion layer 7 via the $P^{++}$-type diffusion layer 8. The impurity concentration in the P-type grounding side diffusion layer 7 is lower than the impurity concentration in the $P^+$-type gate side diffusion layer 6. A silicon oxide film 11 is provided on the N-type well layer 5 and the P-type grounding side diffusion layer 7.

Figure 3:
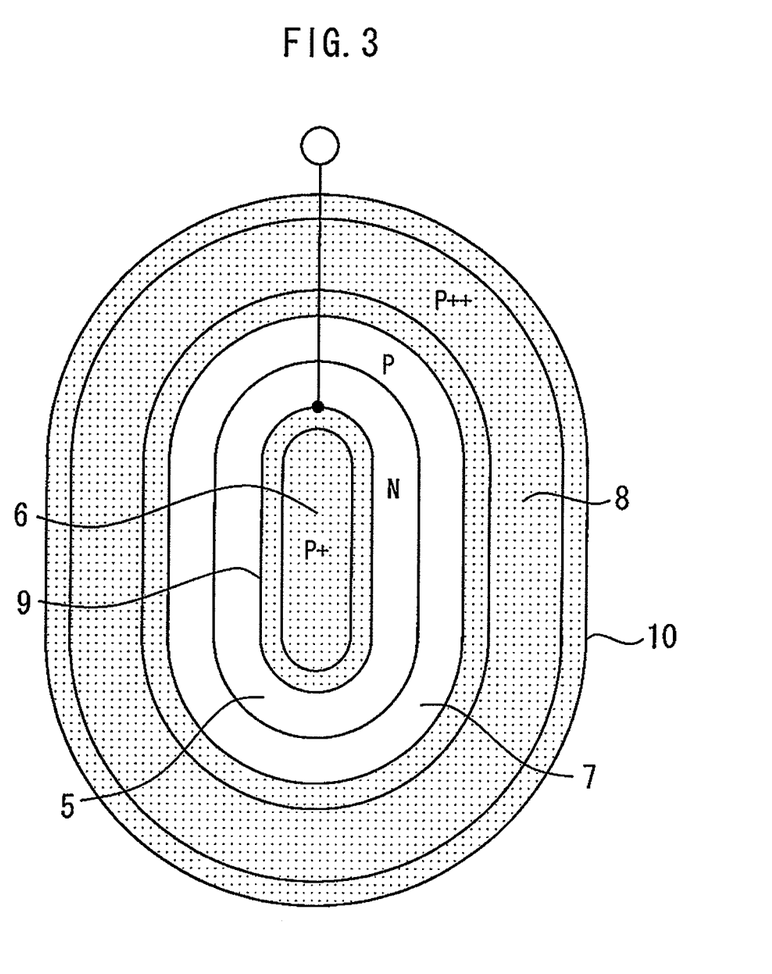
FIG. 3 is a plan view showing a protection diode according to the first embodiment of the present invention.

FIG. 3 is a plan view showing a protection diode according to the first embodiment of the present invention. From the inside to the outside, the N-type well layer 5, the P-type grounding side diffusion layer 7, and the P$^{++}$-type diffusion layer 8 are provided so as to surround the P$^+$-type gate side diffusion layer 6. The gate side electrode 9 is provided on the P$^+$-type gate side diffusion layer 6, and the grounding electrode 10 is provided on the P$^{++}$-type diffusion layer 8.

Next, the operation of the above-described protection diode will be explained. When the surge of the positive voltage is applied to the gate of the MOSFET, the potential of the gate side electrode 9 of the protection diode is elevated. Although no electric field is applied to the P$^+$-type gate side diffusion layer 6 and the N-type well layer 5 joined in the forward direction, the electric field applied to the N-type well layer 5 and the P-type grounding side diffusion layer 7 joined in the reverse direction is increased, and is yielded at a certain voltage. On the other hand, when the surge of a negative voltage is applied to the gate, the potential of the gate side electrode 9 of the protection diode is lowered, an electric field applied to the P$^+$-type gate side diffusion layer 6 and the N-type well layer 5 joined in the reverse direction is increased, and is yielded at a constant voltage. After yielding, a yield current flows.

Here, in the present embodiment, since the impurity concentration in the P-type grounding side diffusion layer 7 is lower than the impurity concentration of the P$^+$-type gate side diffusion layer 6, when the positive voltage is applied to the gate, the P-type grounding side diffusion layer 7 is easily depleted. Therefore, the electric field by reverse bias is mitigated, and the breakdown voltage is elevated when a positive voltage is applied. On the other hand, when a negative voltage is applied, the diode is yielded at a voltage lower than the breakdown voltage when a positive voltage is applied.

Figure 4:
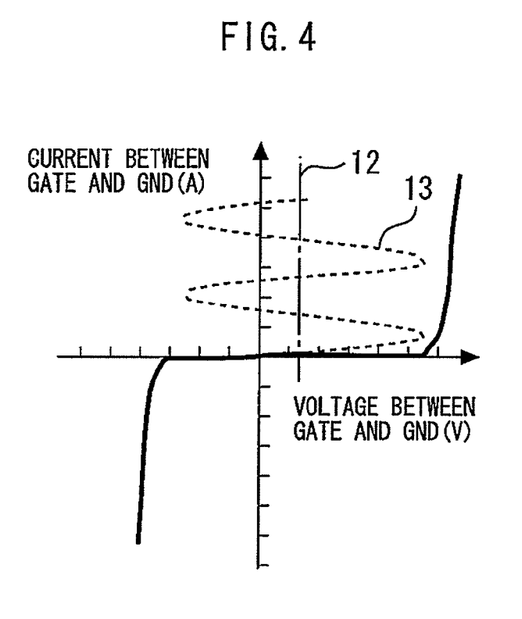
FIG. 4 is a diagram showing the current-voltage characteristics of the protection diode according to the first embodiment of the present invention.
Figure 5:
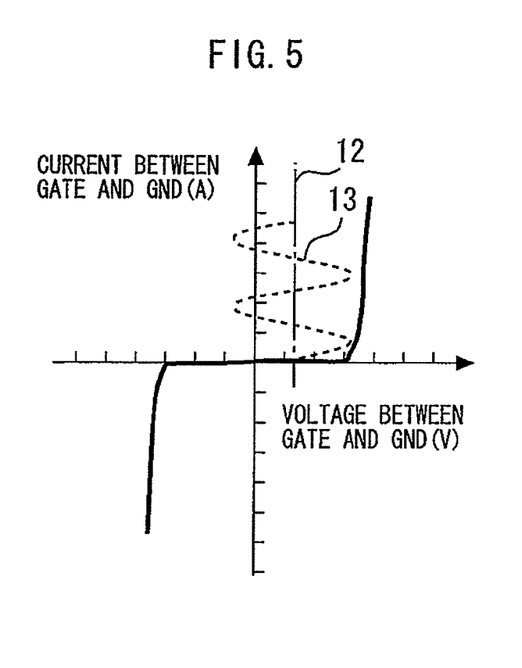
FIG. 5 is a diagram showing the current-voltage characteristics of the protection diode according to the comparative example.

Next, the effect of the first embodiment will be described by comparing with the comparative example. The comparative example is the one wherein the P-type grounding side diffusion layer 7 is changed to a diffusion layer having an impurity concentration identical to the impurity concentration of the P$^+$-type gate side diffusion layer 6. FIG. 4 is a diagram showing the current-voltage characteristics of the protection diode according to the first embodiment of the present invention. FIG. 5 is a diagram showing the current-voltage characteristics of the protection diode according to the comparative example. The abscissa axis shows the voltage between the gate and the grounding. The ordinate axis shows the currents between the gate and the grounding. The numeral 12 shows the positively applied gate voltage when the protection diode is provided in the N-channel MOSFET of AB-class operating power amplification. The numeral 13 shows the gate voltage amplitude wave form in such a case.

In the comparative example, the positive breakdown voltage becomes equivalent with the negative breakdown voltage. Therefore, since the breakdown voltage when the positive voltage is applied cannot be high, the amplitude of the gate voltage is limited by the breakdown voltage when the positive voltage is applied.

In the first embodiment on the other hand, since the impurity concentration of the P-type grounding side diffusion layer 7 is lower than the impurity concentration of the P$^+$-type gate side diffusion layer 6, when a positive voltage is applied to the gate, the P-type grounding side diffusion layer 7 is easily depleted. Therefore, since the electric field is mitigated by the reverse bias, the breakdown voltage is elevated when a positive voltage is applied, and the amplitude of the gate voltage can be larger than the amplitude of the gate voltage in the comparative example. In addition, because of the bidirectional diode, the gate voltage does not reach the breakdown voltage when a negative voltage is applied. Therefore, since the input voltage of the MOSFET in the present embodiment can be increased from that of the comparative example, higher outputs can be realized.

Further, the breakdown voltage of the N-type well layer 5 and the P-type grounding side diffusion layer 7, or the breakdown voltage of the P$^+$-type gate side diffusion layer 6 and N-type well layer 5 are set to be lower than the insulation breakdown voltage of the gate oxide film. Thereby, since the surge is grounded via the protection diode 2 and an excessive voltage is not applied to the gate oxide film, insulation breakdown or characteristics deterioration can be prevented.

Second Embodiment

Figure 6:
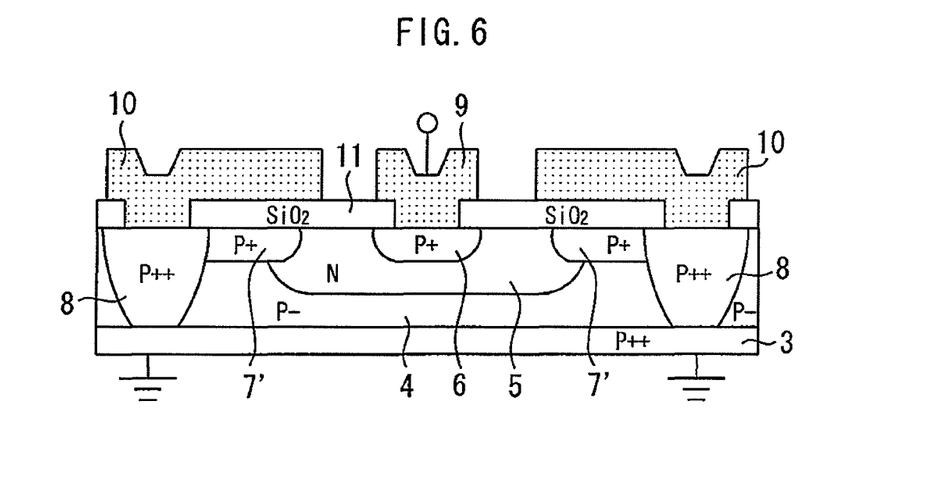
FIGS. 6 and 7 are the sectional view and the plan view showing a protection diode according to the second embodiment of the present invention, respectively.
Figure 7:
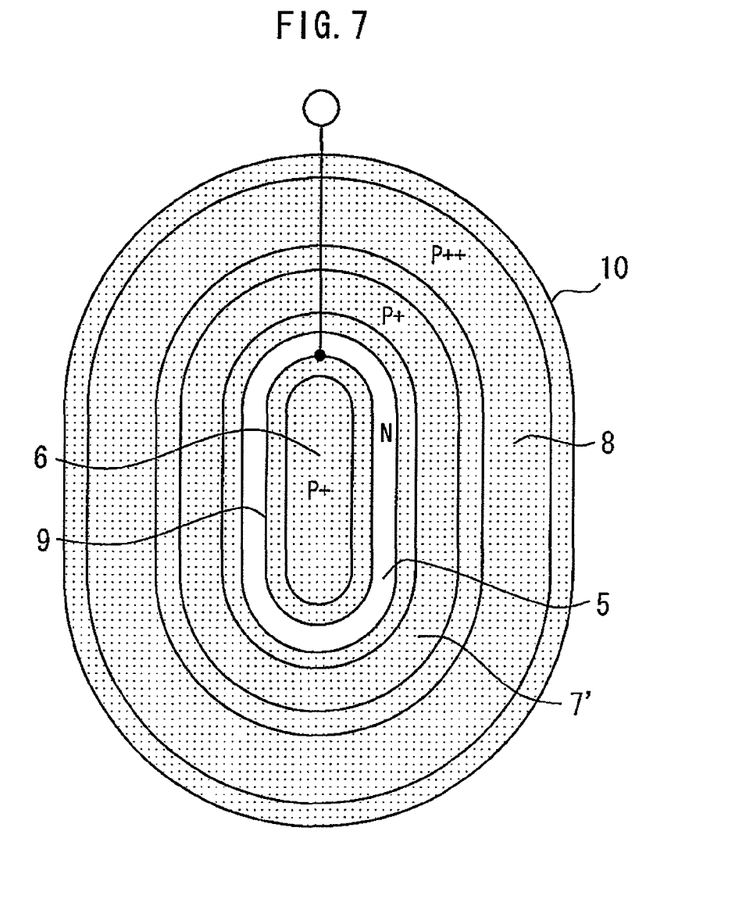

FIGS. 6 and 7 are the sectional view and the plan view showing a protection diode according to the second embodiment of the present invention, respectively. A grounding electrode 10 extends to the N-type well layer 5 via a silicon oxide film 11.

In place of the P-type grounding side diffusion layer 7, a P$^+$-type grounding side diffusion layer 7' having the impurity concentration identical to the impurity concentration of the P$^+$-type gate side diffusion layer 6 is provided. Other components are identical to the components in the first embodiment. When the surge of a positive voltage is applied to the gate, the electric field of the N-type well layer 5 and the P$^+$-type grounding side diffusion layer 7' joined in opposite directions is increased, and is yielded at a constant voltage. At this time, since the grounding electrode 10 on the N-type well layer 5 functions as a field plate having a grounding potential, the surface of the N-type well layer 5 is easily depleted. For this reason, the electric field by the reverse bias is mitigated, and the breakdown voltage when the positive voltage is applied becomes higher than the breakdown voltage when the negative voltage is applied. Therefore, since the input voltage of the MOSFET can be increased in the same manner as in the first embodiment, higher output can be realized.

Third Embodiment

Figure 8:
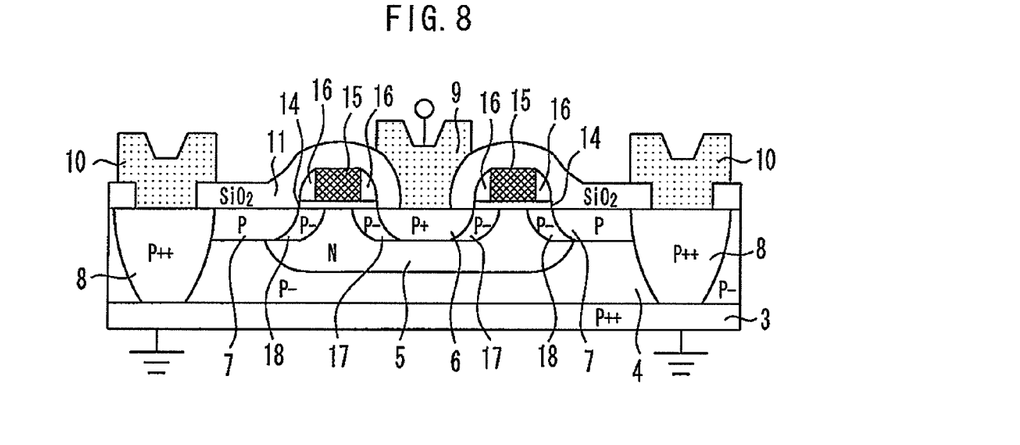
FIG. 8 is a sectional view showing a protection diode according to third embodiment of the present invention.
Figure 9:
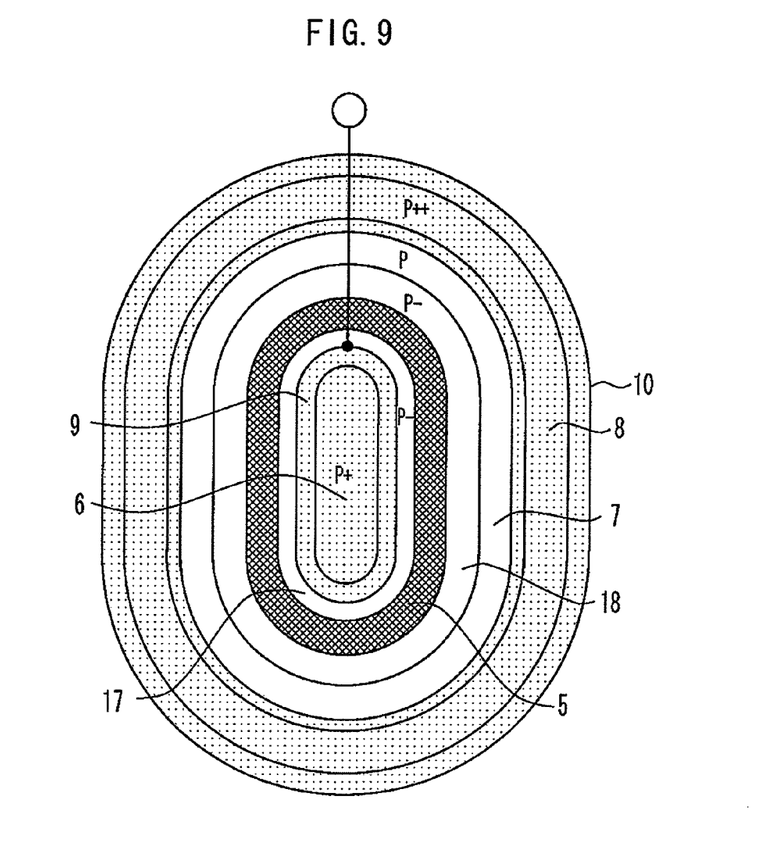
FIG. 9 is a plan view showing a protection diode according to third embodiment of the present invention.

FIGS. 8 and 9 are a sectional view and a plan view showing a protection diode according to third embodiment of the present invention, respectively. Adding to the configuration of the first embodiment, a dummy gate electrode 15 is provided on the N$^-$-type well layer 5 via the gate insulating film 14. A sidewall 16 is provided on the side surface of the dummy gate electrode 15. P$^-$-type diffusion layers 17 and 18 are provided immediately below the sidewall 16. The P$^-$-type diffusion layers 17 and 18 have an impurity concentration lower than the impurity concentration of the P-type grounding side diffusion layer 7. The P$^+$-type gate side diffusion layer 6 and the P-type grounding side diffusion layer 7 are joined to the N-type well layer 5 via the P$^-$-type diffusion layers 17 and 18, respectively.

These configurations can be simultaneously formed when the corresponding configuration of the MOSFET 1 is formed. In particular, at the same time as the formation of the gate insulating film and the gate electrode of the MOSFET 1, the gate insulating film 14 and the dummy gate electrode 15 are formed. Next, a P-type impurity is injected using the dummy gate electrode 15 as a mask to form P$^-$-type diffusion layers 17 and 18. Next, by forming a silicon oxide film on the entire surface by CVD method and being subjected to anisotropic etching, a sidewall 16 is left on the side surface of the dummy gate electrode 15. Then, a P-type impurity is injected using the dummy gate electrode 15 and the sidewall 16 as a mask, the P$^+$-type gate side diffusion layer 6 and the P-type grounding side diffusion layer 7 are formed.

When a positive voltage is applied to the gate, the P-type grounding side diffusion layer 7 and the P$^-$-type diffusion layer 18, having low impurity concentration, are depleted, an electric field is mitigated by the reverse bias, and the breakdown voltage when the positive voltage is applied is elevated. On the other hand, although the P⁻-type diffusion layer 17 having a low impurity concentration is depleted when the negative voltage is applied, the P⁺-type gate side diffusion layer 6 having a high impurity concentration is not depleted, the diode is yielded at a lower voltage than the breakdown voltage when a positive voltage is applied. As described above, since the P⁻-type diffusion layers 17 and 18 mitigate the electric field when the reverse bias is applied, the area of the protection diode can be reduced while maintaining the breakdown voltage comparing to the first embodiment.

Fourth Embodiment

Figure 10:
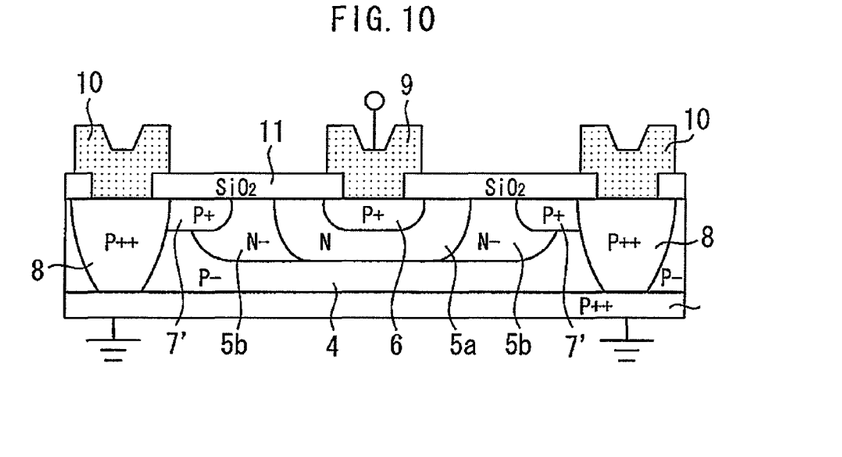
FIG. 10 is a sectional view showing the protection diode according to the fourth embodiment of the present invention.
Figure 11:
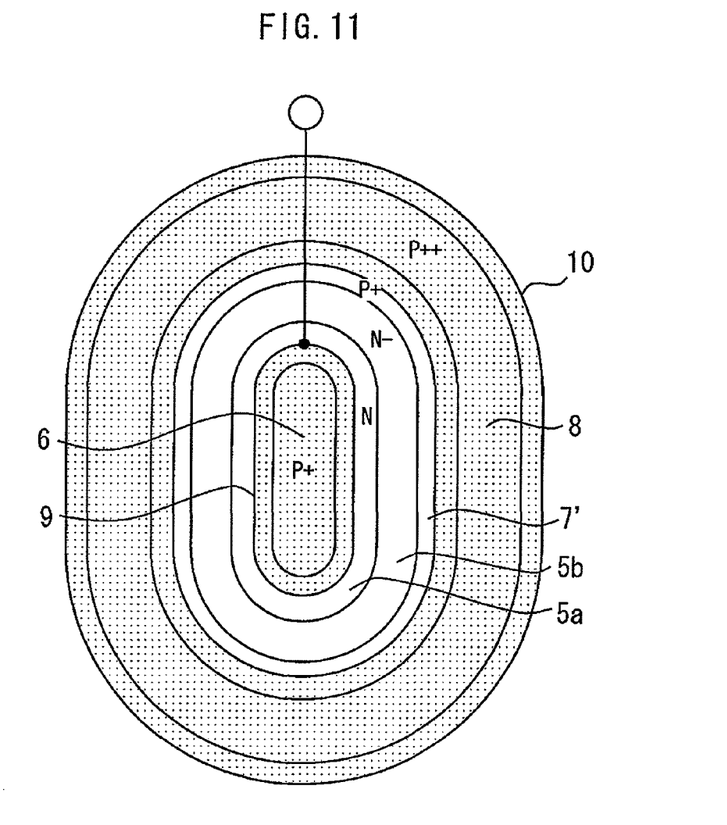
FIG. 11 is a plan view showing the protection diode according to the fourth embodiment of the present invention.

FIGS. 10 and 11 are a sectional view and a plan view showing the protection diode according to the fourth embodiment of the present invention, respectively. In place of the N-type well layer 5 in the first embodiment, an N-type gate side well layer 5a, and an N⁻-type grounding side well layer 5b joined to the N-type gate side well layer 5a are provided. A P⁺-type gate side diffusion layer 6 joins to the N-type gate side well layer 5a, and a P⁺-type grounding side diffusion layer 7' is joined to the N⁻-type grounding side well layer 5b. The impurity concentration of the P⁺-type gate side diffusion layer 6 is identical to the impurity concentration of the P⁺-type grounding side diffusion layer 7'.

When the surge of a positive voltage is applied to the gate, the electric fields of the N⁻-type grounding side well layer 5b and the P⁺-type grounding side diffusion layer 7' joined in the opposite direction is increased, and is yielded at a constant voltage. Here, since the N⁻-type grounding side well layer 5b has a lower impurity concentration than the N-type gate side well layer 5a, it is easily depleted when the reverse bias is applied. For this reason, the electric field by the reverse bias is mitigated, and the breakdown voltage when a positive voltage is applied becomes higher than the breakdown voltage when a negative voltage is applied. Therefore, since the input voltage of the MOSFET can be increased in the same manner as in the first embodiment, higher outputs can be realized.

In addition, since the P⁺⁺-type diffusion layer 8 can be approached to the center (the side of the P⁺-type gate side diffusion layer 6), the area of the protection diode can be decreased from that of the first embodiment.

Fifth Embodiment

Figure 12:
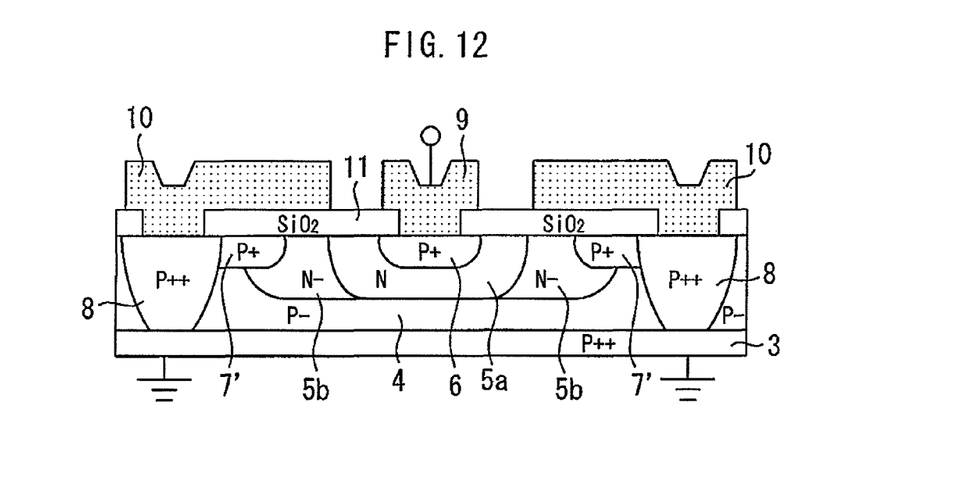
FIG. 12 is a sectional view showing the protection diode according to the fifth embodiment of the present invention.
Figure 13:
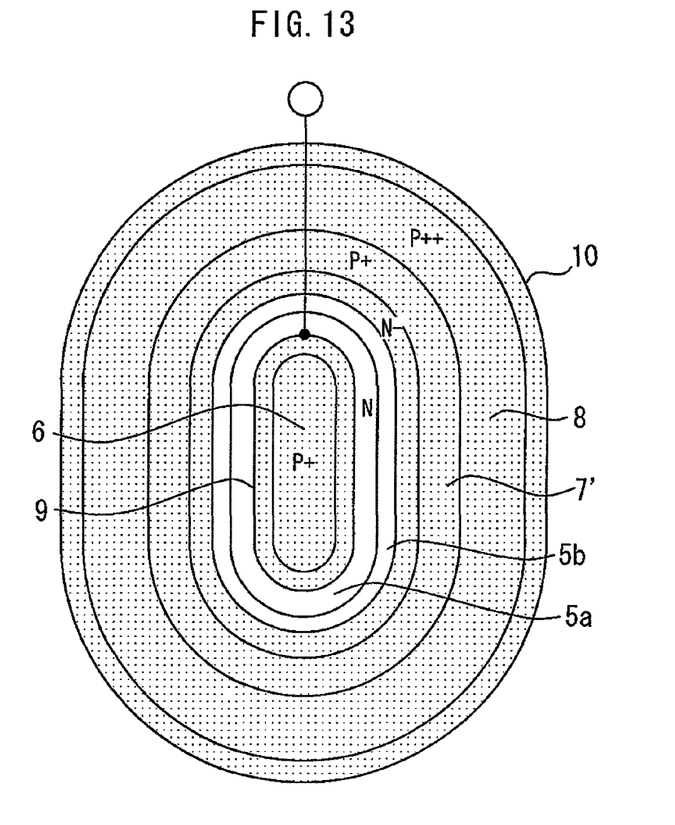
FIG. 13 is a plan view showing the protection diode according to the fifth embodiment of the present invention.

FIGS. 12 and 13 are a sectional view and a plan view showing the protection diode according to the fifth embodiment of the present invention, respectively. In the same manner as in the second embodiment, the grounding electrode 10 extends to the N-type well layer 5 via the silicon oxide film 11. Other components are identical to the fourth embodiment. Thereby, the effects of the second and fourth embodiments can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2012-089538, filed on Apr. 10, 2012, including specification, claims, drawings, and summary, on which the Convention priority of the present application is based, is incorporated herein by reference in its entirety.

What is claimed is:

1. A protection diode comprising:
   a semiconductor substrate;
   a well region of a first conductivity type in the semiconductor substrate;
   a gate side diffusion region of a second conductivity type in the semiconductor substrate and within and surrounded by the well region;
   a grounding side diffusion region of the second conductivity type in the semiconductor substrate, separated from the gate side diffusion region by part of the well region, and surrounding and joined to the well region;
   a gate side electrode connected between a gate of a transistor protected by the protection diode and the gate side diffusion region;
   a grounding electrode connected to the grounding side diffusion region; and
   an insulating film disposed on the semiconductor substrate, between the gate side electrode and the grounding electrode, and covering parts of the well region, the gate side diffusion region, and the grounding side diffusion region, wherein the grounding electrode extends on the insulating film directly opposite and covering the grounding side diffusion region, whereby breakdown voltage of the protection diode differs depending upon polarity of a surge voltage applied between the gate side electrode and the grounding side electrode.

2. The protection diode according to claim 1, wherein dopant impurity concentration in the grounding side diffusion region is identical to dopant impurity concentration in the gate side diffusion region.

\* \* \* \* \*